United States Patent
Crevasse et al.

(10) Patent No.: US 6,206,976 B1
(45) Date of Patent: Mar. 27, 2001

(54) DEPOSITION APPARATUS AND RELATED METHOD WITH CONTROLLABLE EDGE EXCLUSION

(75) Inventors: Annette Margaret Crevasse, Apopka; Adrienne Gould-Choquette, Orlando, both of FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/383,829

(22) Filed: Aug. 27, 1999

(51) Int. Cl.⁷ .................................................. C23C 16/00
(52) U.S. Cl. ...................... 118/720; 118/728; 118/729; 118/730; 118/715; 118/500; 118/504; 204/298.07; 204/298.11; 204/298.15
(58) Field of Search ................... 118/715, 720, 118/721, 724, 725, 728, 729, 730, 500, 504; 156/345; 204/298.07, 298.11, 298.15

(56) References Cited

U.S. PATENT DOCUMENTS

| | | | |
|---|---|---|---|
| 4,932,358 | 6/1990 | Studley et al. | 118/728 |
| 5,516,367 | 5/1996 | Lei et al. | 118/725 |
| 5,578,532 | 11/1996 | van de Ven et al. | 437/245 |
| 5,620,525 | * 4/1997 | van de Ven et al. | 118/728 |
| 5,843,233 | * 12/1998 | van de Ven et al. | 118/715 |
| 5,922,133 | 7/1999 | Tepmnan et al. | 118/720 |
| 5,985,033 | * 11/1999 | Yudovsky et al. | 118/715 |
| 6,040,011 | * 3/2000 | Yudovsky et al. | 427/255.28 |
| 6,096,135 | * 8/2000 | Guo et al. | 118/729 |

* cited by examiner

Primary Examiner—Jeffrie R. Lund
(74) Attorney, Agent, or Firm—Allen, Dyer, Doppelt, Milbrath & Gilchrist, P.A.

(57) ABSTRACT

A deposition apparatus includes a controllable edge exclusion assembly for controllably excluding deposition adjacent a peripheral edge of a wafer within a deposition chamber and based upon fluid flow. The controllable edge exclusion assembly includes a ring-shaped body extending inwardly from the peripheral edge of the wafer and spaced above an adjacent front surface of the wafer. The ring-shaped body has fluid passageways so that fluid flow from adjacent a back surface of the wafer passes over the peripheral edge of the wafer and through the fluid passageways to thereby exclude deposition adjacent the peripheral edge of the wafer. The assembly also includes a flow controller associated with the fluid passageways for controlling fluid flow therethrough. The flow controller may include a control body having a plurality of fluid passageways therein, and which is relatively movable with respect to the ring-shaped body. This relative movement provides a selectable amount of alignment between the fluid passageways of the control body and the ring-shaped body to thereby control fluid flow. In another embodiment, the flow controller includes respective iris diaphragms for the fluid passageways.

36 Claims, 9 Drawing Sheets

DEPOSITION APPARATUS AND RELATED METHOD WITH CONTROLLABLE EDGE EXCLUSION

FIELD OF THE INVENTION

The present invention relates to semiconductor processing and manufacture, and, more particularly, to an apparatus and method for excluding undesired deposition near a wafer edge.

BACKGROUND OF THE INVENTION

Integrated circuits are used in many electronic devices. A typical integrated circuit includes a semiconductor substrate including active regions, and one or more interconnect layers formed on the substrate. The adjacent interconnect layers are typically separated by an interlevel dielectric layer. A semiconductor wafer including a plurality of integrated circuit die may be positioned into a plasma deposition chamber to deposit some of the desired layers. The wafer is cut after processing into the discrete integrated circuit die.

Tungsten, tungsten silicide and titanium nitride, for example, are metals that are conventionally deposited on the wafer by chemical vapor deposition (CVD) during manufacturing. These metals may be deposited in a reaction chamber that holds from one to several wafers, and which also supplies an elevated temperature and/or plasma to enhance the deposition. Unfortunately, such metals would also be deposited on the edge and backside of the wafer if these areas were unprotected during CVD. The metals tend to peel and flake and would contaminate other portions of the wafer during subsequent processing steps. Also, any residual metal can be sputtered back onto the surface during subsequent processing steps.

One approach to preventing undesired deposition on the backside and particularly the edge of the wafer is disclosed, for example, in U.S. Pat. No. 5,843,233 to van de Ven et al. and assigned to Novellus Systems, Inc. Novellus also offers the system described in the patent as its minimal overlap exclusion ring (MOER) process. The apparatus includes a chamber for positioning of five wafers therein, a pedestal to support each wafer, and an exclusion ring for each wafer.

The exclusion ring includes an extension which slightly overlaps the front peripheral region of the wafer and defines a restrictive gap or opening therewith. So-called deposition control gas is introduced under the exclusion guard extension and exits through the gap. Orifices may be provided through the extension to further increase uniformity of deposition on the front of the wafer adjacent the edge.

To increase the useable area on the wafer, the deposition is desirably uniform until reaching the edge. For example, for a 200 mm wafer, a 6 mm ring of the wafer was left unusable in the past. More recently, the ring is now desirably reduced to only 4 mm. Many wafers include beveled edges which complicates the mechanics of deposition edge exclusion. In addition, a typical deposition chamber is desirably used for a number of different processes, some with slower deposition rates, and others with faster rates. Unfortunately, to accommodate different processes typically requires compromising flow rates and deposition chemistry to ensure proper edge exclusion. In addition, as the chamber is continually used, deposits also tend to build-up on the surfaces of the exclusion ring. Accordingly, these must be periodically cleaned to ensure adequate performance. Opening the chamber for such cleaning may result in many hours of downtime for the apparatus. Changing the rings to substitute others with different dimensions would also entail significant apparatus downtime, and is therefore impractical.

SUMMARY OF THE INVENTION

In view of the foregoing background, it is therefore an object of the invention to provide an apparatus and method for providing edge deposition exclusion in wafer processing, and while permitting control of the edge exclusion effect.

This and other objects, features and advantages in accordance with the present invention are provided by a controllable edge exclusion assembly for controllably excluding deposition adjacent a peripheral edge of a wafer within a deposition chamber and based upon fluid flow. More particularly, the controllable edge exclusion assembly preferably comprises a ring-shaped body extending inwardly from the peripheral edge of the wafer and spaced above an adjacent front surface of the wafer. The ring-shaped body may have a plurality of fluid passageways extending therethrough so that fluid flow from adjacent a back surface of the wafer passes over the peripheral edge of the wafer and through the fluid passageways to thereby exclude deposition adjacent the peripheral edge of the wafer. Moreover, the assembly also preferably further includes a flow controller associated with the fluid passageways of the ring-shaped body for controlling fluid flow therethrough. Accordingly, the edge exclusion effect can be controlled without changing out fixed-dimension exclusion rings. The temperature, deposition flow rates, and chemistry can be adjusted to optimize film properties, while the edge exclusion can be controlled relatively independently in accordance with the invention.

In one embodiment, the flow controller comprises a control body having a plurality of fluid passageways therein, and the control body is relatively movable with respect to the ring-shaped body. This relative movement provides a selectable amount of alignment between the fluid passageways of the control body and the ring-shaped body to thereby control fluid flow. In one particularly advantageous variation, the control body and the ring-shaped body are relatively rotatable. For example, the ring-shaped body may be fixed relative to a wafer support, and the control body may be rotatable relative to the ring-shaped body.

The control body may be positioned adjacent an upper surface of the ring-shaped body opposite the wafer. In addition, the fluid passageways of the control body may have a substantially same cross-sectional area as the fluid passageways of the ring-shaped body. In another variation, at least one of the control body and the ring-shaped body has a plurality of sets of fluid passageways therein of different cross-sectional areas. These different sets can be selectively connected in alignment with opposing passageways to thereby control flow. The control body may also have a ring shape.

The flow controller also preferably comprises a drive device for relatively moving the control body and ring-shaped body responsive to control signals. These control signals may be generated externally from the deposition chamber. Accordingly, the flow rate can be set without opening the deposition chamber and suffering the resultant apparatus downtime.

In another embodiment of the invention, the flow controller comprises respective iris diaphragms for the fluid passageways. The cross-sectional open area of the iris diaphragms may be controlled to control fluid flow. Of course, in this embodiment, the flow controller also preferably includes a drive device for controlling the iris diaphragms responsive to control signals. These control signals can also be generated externally from the deposition chamber.

A method aspect of the invention is for deposition exclusion adjacent a peripheral edge of a wafer within a deposition chamber and based upon fluid flow. The method preferably comprises the steps of: positioning a ring-shaped body extending inwardly from the peripheral edge of the wafer and spaced above an adjacent front surface of the wafer, the ring-shaped body having a plurality of fluid passageways extending therethrough; setting a flow controller associated with the fluid passageways of the ring-shaped body for a desired fluid flow therethrough; and generating a fluid flow from adjacent a back surface of the wafer to pass over the peripheral edge of the wafer and through the fluid passageways of the ring-shaped body to thereby exclude deposition adjacent the peripheral edge of the wafer.

In one embodiment, the flow controller comprises a control body having a plurality of fluid passageways therein and being relatively movable with respect to the ring-shaped body. Accordingly, the step of setting the flow controller comprises relatively moving the control body to provide a selected amount of alignment between the fluid passageways of the control body and the ring-shaped body to thereby control fluid flow.

In another embodiment, the flow controller comprises respective iris diaphragms for the fluid passageways. Accordingly, the step of setting the flow control device comprises setting the iris diaphragms to a desired cross-sectional area.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, prime and double prime notation is used to indicate similar elements in alternate embodiments. The size of various regions and layers may be exaggerated in the figures for clarity of explanation.

Figure 1:
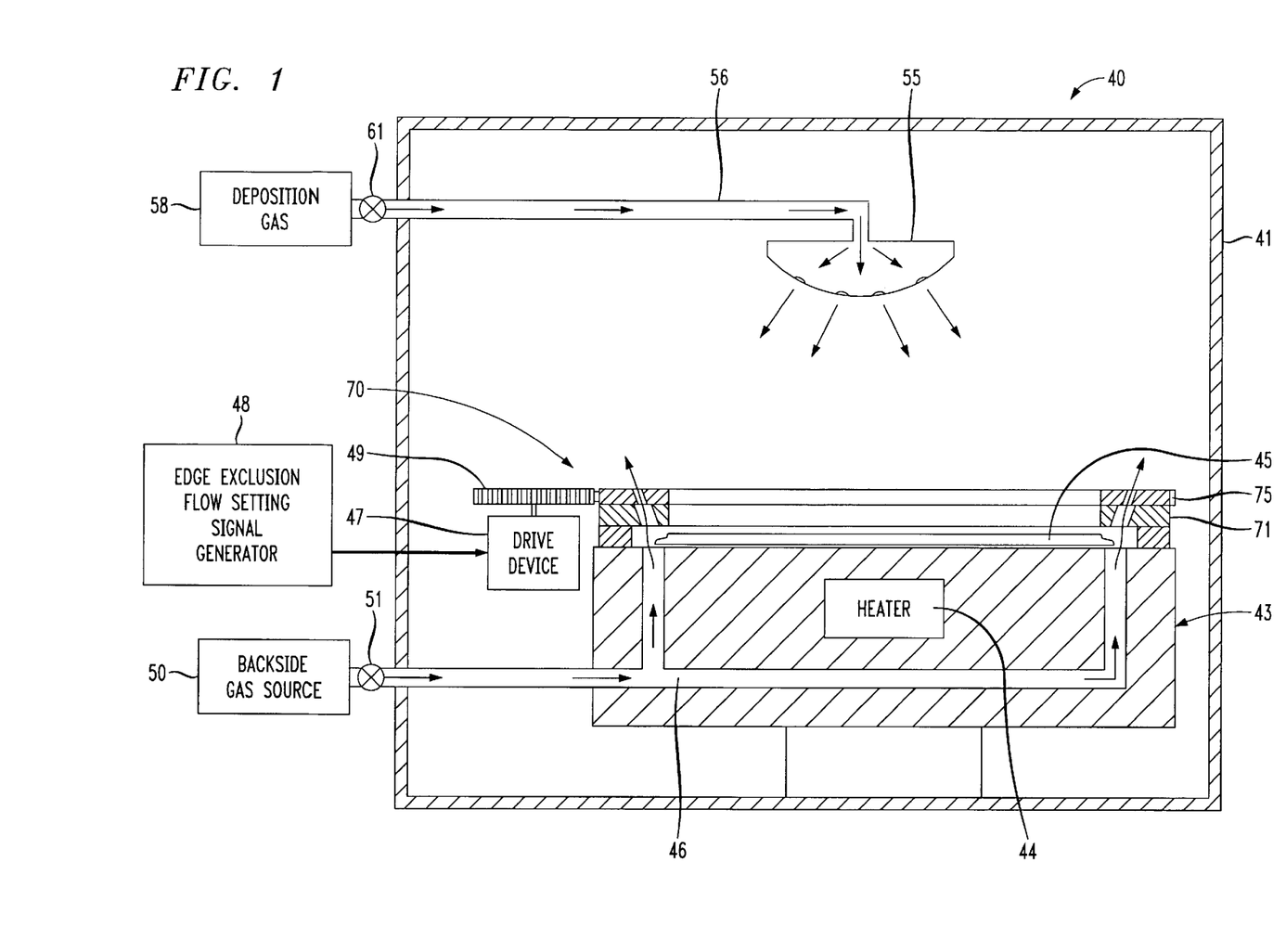
FIG. 1 is a schematic diagram of a deposition apparatus in accordance with the present invention.
Figure 2:
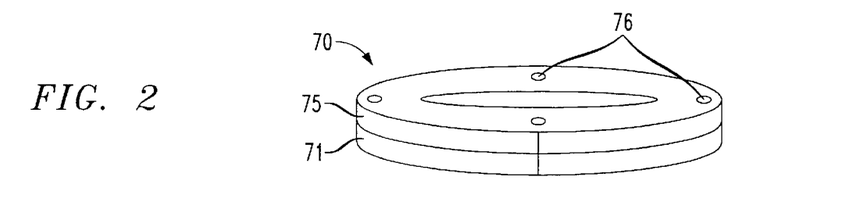
FIG. 2 is a perspective view of a first embodiment of an edge exclusion assembly as shown in FIG. 1 and illustrated in the full open position.
Figure 3:
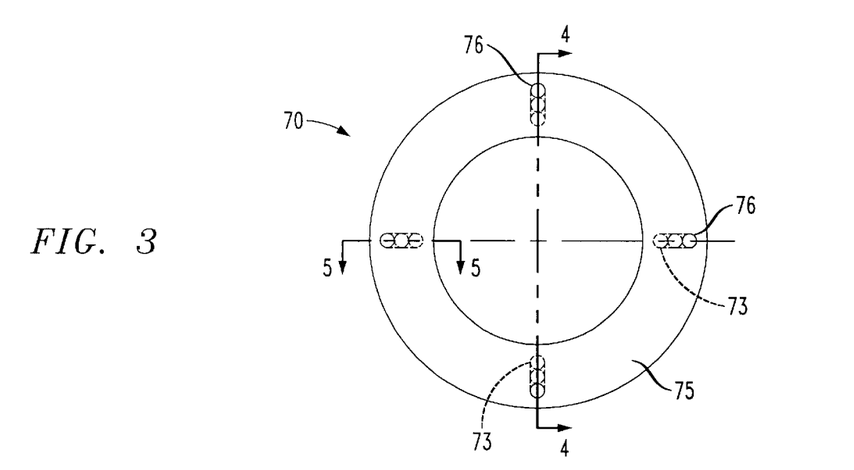
FIG. 3 is a top plan view of the edge exclusion assembly shown in FIG. 2.
Figure 4:
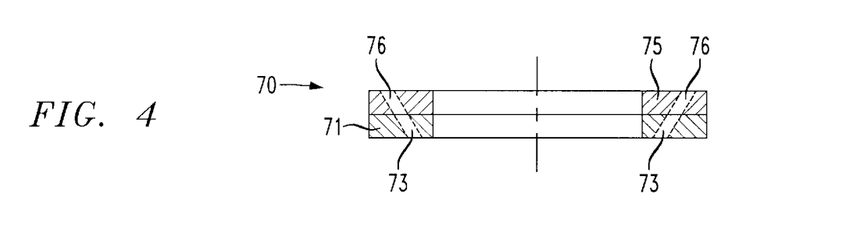
FIG. 4 is a cross-sectional view taken along lines 4—4 of FIG. 3.
Figure 5:
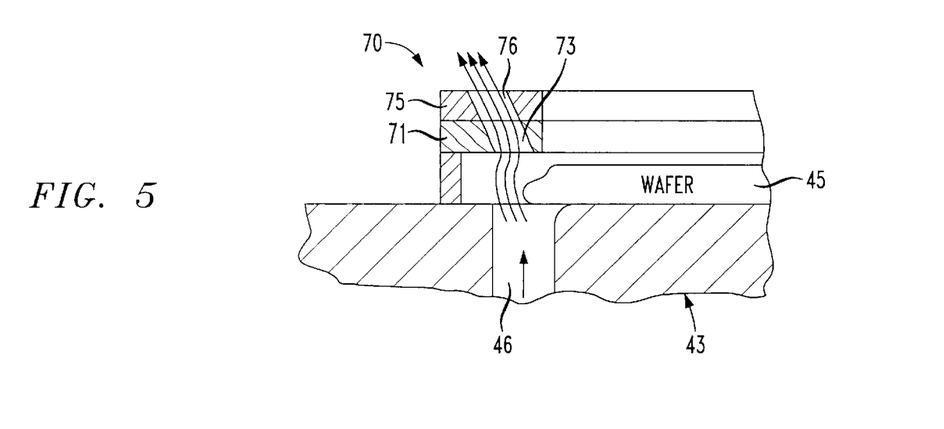
FIG. 5 is a greatly enlarged cross-sectional view of the wafer edge portion and adjacent portion of the edge exclusion assembly taken along lines 5—5 of FIG. 3.
Figure 6:
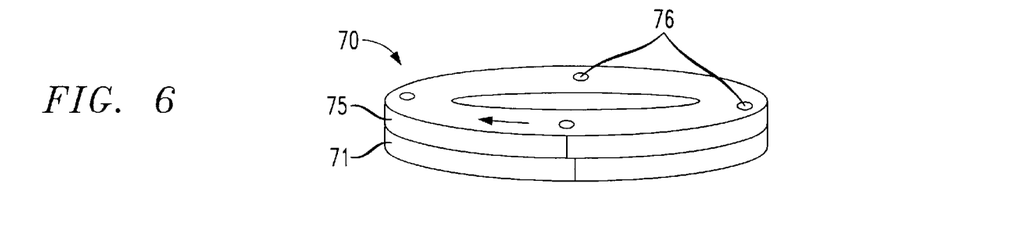
FIG. 6 is a perspective view of the first embodiment of the edge exclusion assembly as shown in FIG. 2 and illustrated in a restricted flow position.
Figure 7:
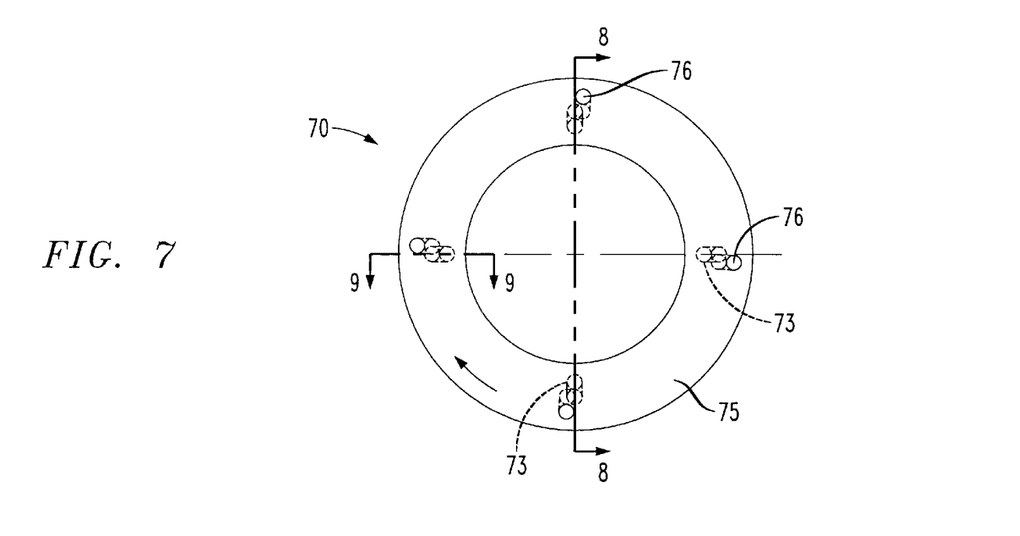
FIG. 7 is a top plan view of the assembly shown in FIG. 6.
Figure 8:
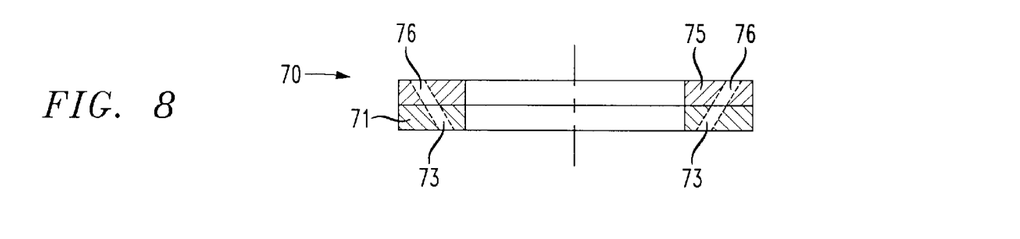
FIG. 8 is a cross-sectional view of the edge exclusion assembly taken along lines 8—8 of FIG. 7.
Figure 9:
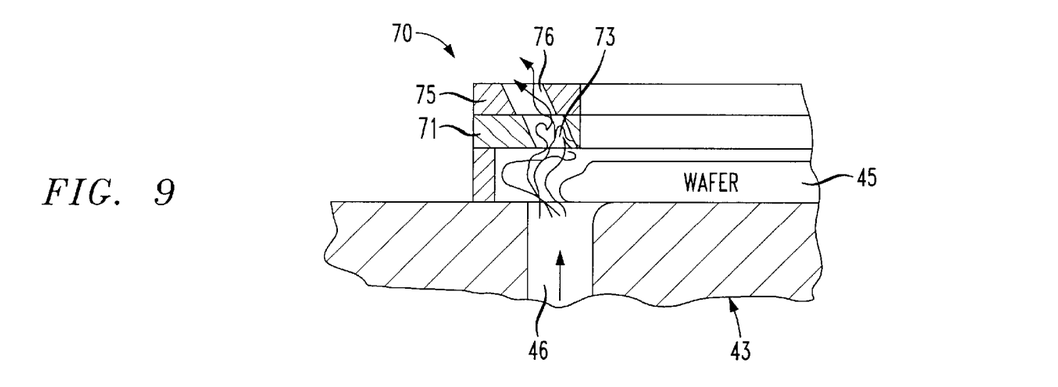
FIG. 9 is a greatly enlarged cross-sectional view of the wafer edge portion and adjacent portion of the edge exclusion assembly taken along lines 9—9 of FIG. 7.
Figure 10:
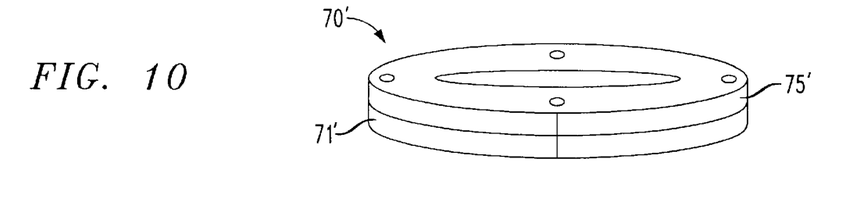
FIG. 10 is a perspective view of a second embodiment of an edge exclusion assembly in accordance with the invention and illustrated in the full open position.
Figure 11:
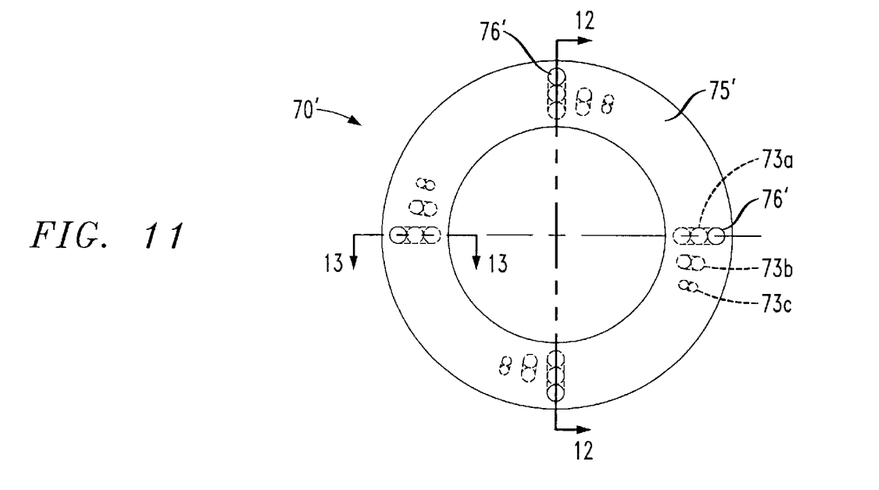
FIG. 11 is a top plan view of the edge exclusion assembly shown in FIG. 10.
Figure 12:
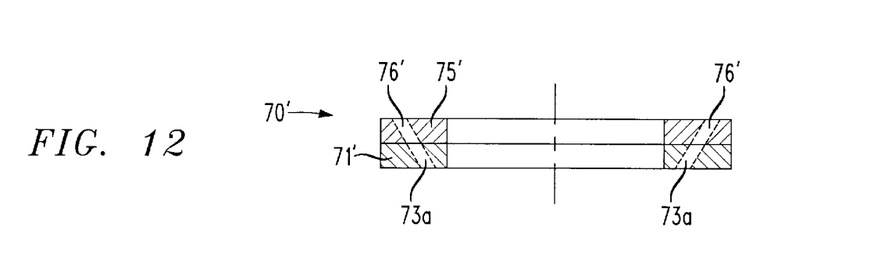
FIG. 12 is a cross-sectional view of the assembly taken along lines 12—12 of FIG. 11.
Figure 13:
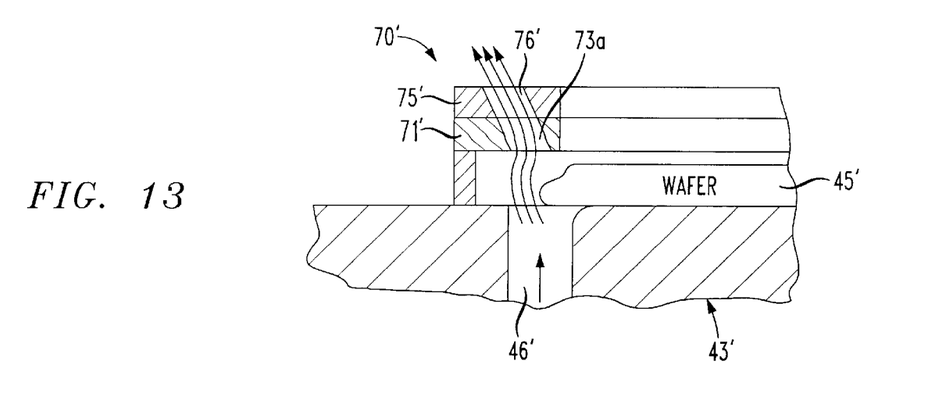
FIG. 13 is a greatly enlarged cross-sectional view of the wafer edge portion and adjacent portion of the assembly taken along lines 13—13 of FIG. 11.
Figure 14:
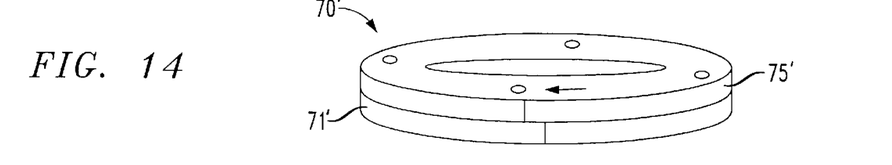
FIG. 14 is a perspective view of the second embodiment of the edge exclusion assembly as shown in FIG. 10 and illustrated in a first restricted flow position.
Figure 15:
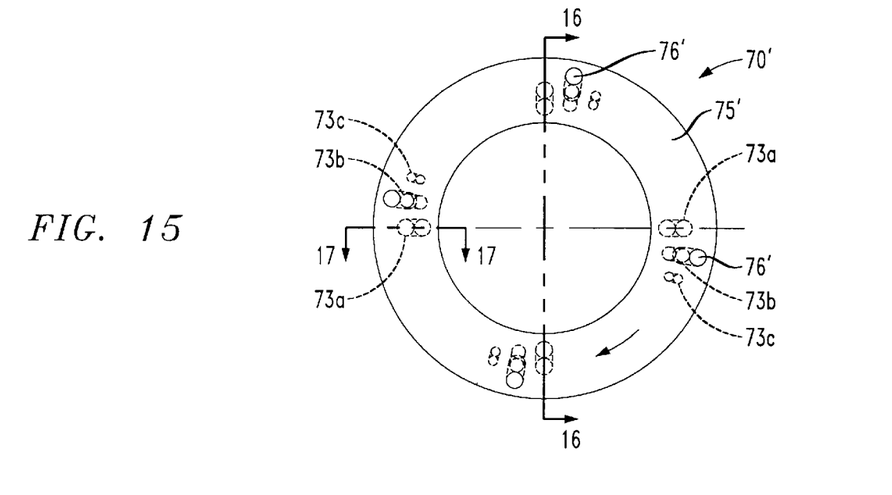
FIG. 15 is a top plan view of the edge exclusion assembly shown in FIG. 14.
Figure 16:
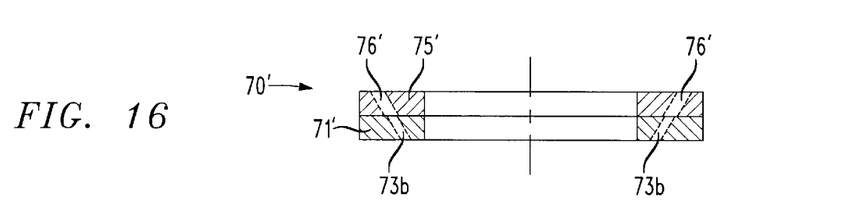
FIG. 16 is a cross-sectional view of the edge exclusion assembly taken along lines 16—16 of FIG. 15.
Figure 17:
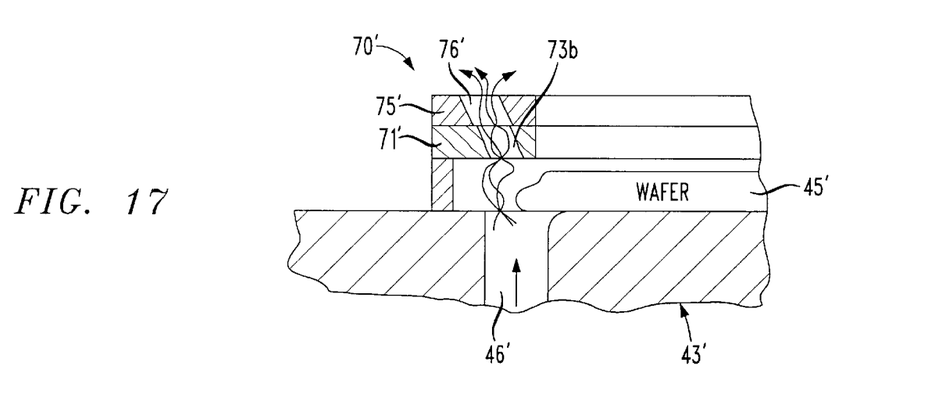
FIG. 17 is a greatly enlarged cross-sectional view of the wafer edge portion and adjacent portion of the edge exclusion assembly taken along lines 17—17 of FIG. 15.
Figure 18:
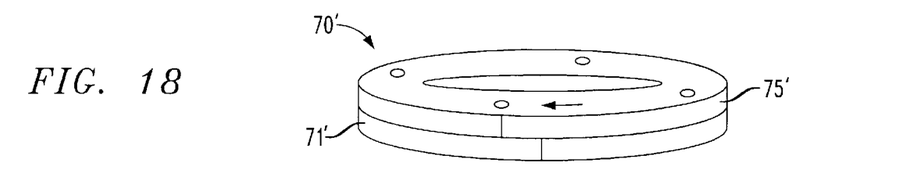
FIG. 18 is a perspective view of the second embodiment of the edge exclusion assembly as shown in FIG. 10 and illustrated in a second restricted flow position.
Figure 19:
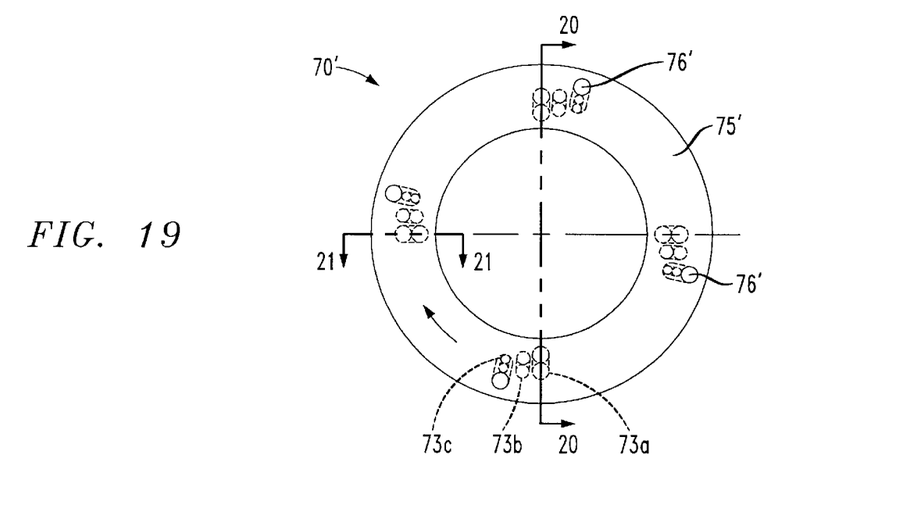
FIG. 19 is a top plan view of the edge exclusion assembly shown in FIG. 18.
Figure 20:
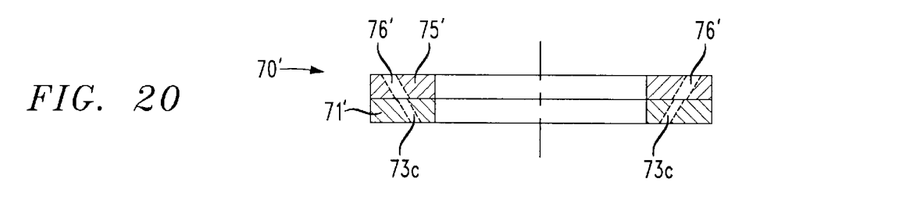
FIG. 20 is a cross-sectional view of the edge exclusion assembly taken along lines 20—20 of FIG. 19.
Figure 21:
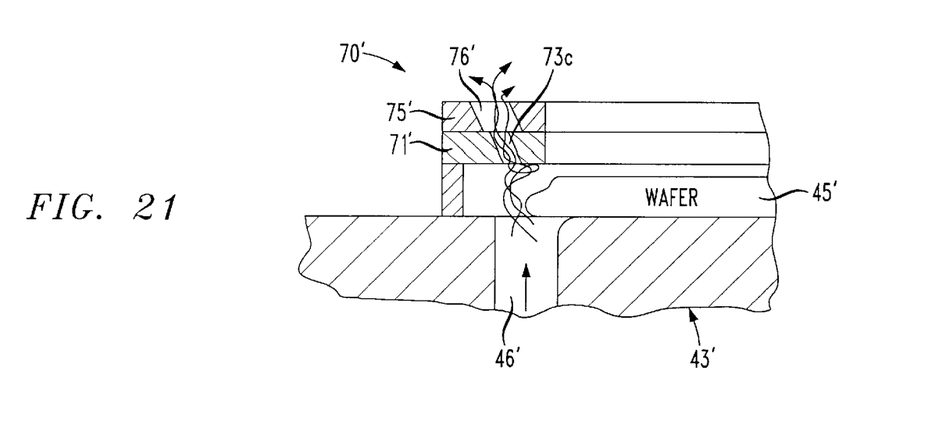
FIG. 21 is a greatly enlarged cross-sectional view of the wafer edge portion and adjacent portion of the edge exclusion assembly taken along lines 21—21 of FIG. 19.

Referring initially to FIGS. 1 through 9, a first embodiment of the invention is now described. As shown in FIG. 1, the invention is directed to a deposition apparatus 40 which includes a deposition chamber 41, and a support 43 for supporting a semiconductor wafer 45 therein. The support 43 may be in the form of the schematically illustrated pedestal mounted within the chamber 41. A heater 44 is illustratively associated with the support 43 to provide heat to the wafer 45 during deposition as will be readily appreciated by those skilled in the art. The deposition chamber 41 may also generate a plasma or be connected to a remote plasma source to facilitate deposition.

As will also be readily appreciated by those skilled in the art, the support 43 may also include fluid passageways for supplying vacuum to hold the wafer 45 firmly in position. In addition, in a typical deposition chamber, a number of wafer processing positions may be included. For clarity of illustration of the invention, only one such position is schematically illustrated. The apparatus 40 may also include wafer handling mechanisms to advance wafers between processing stations, and to facilitate loading and unloading of wafers from the chamber 41. The apparatus 40 may also include a load lock chamber, not shown, to initially receiver wafers to be processed as will be appreciated by those skilled in the art.

Positioned above the support 43 is a distribution head 55 for the deposition gas. The deposition gas is communicated from the schematically illustrated deposition gas source 58 via the conduit 56. The flow is controllable using the control valve 61 connected between the source 58 and the distribution head 55 as will be readily appreciated by those skilled in the art.

One of the key advantages of the apparatus 40 of the present invention is that it can reduce the undesired deposition of certain materials on the edge of the wafer 45. These materials especially include metals, such as tungsten, tungsten silicide, and titanium nitride, for example as will be appreciated by those skilled in the art. Such materials may flake off and contaminate subsequent processing operations.

The support 43 includes fluid passageways 46 therethrough to communicate backside gas from a backside gas source 50 outside the chamber 41 as will be readily appreciated by those skilled in the art. The flow of the backside gas may be controlled, at least in part, by a flow control valve 51. The chemistry of the backside gas can be selected depending on the particular film being deposited as will be appreciated by those skilled in the art. For example, the backside gas may include one or more components reactive with the deposition gas as disclosed, for example, in U.S. Pat. No. 5,843,233, the entire disclosure of which is incorporated herein by reference. Alternately, the backside gas may include one or more inert gasses, such as argon or nitrogen, for example.

The deposition apparatus 40 includes a controllable edge exclusion assembly, generally designed by numeral 70, for controllably excluding deposition adjacent a peripheral edge of the wafer 45 positioned within the deposition chamber 41 and based upon fluid flow. As illustrated in FIGS. 1–9, a first embodiment of the controllable edge exclusion assembly 70 comprises a ring-shaped body 71 extending inwardly from the peripheral edge of the wafer 45 and spaced above an adjacent front surface of the wafer.

The ring-shaped body 71 may have a plurality of fluid passageways 73 extending therethrough so that fluid flow from adjacent a back surface of the wafer 45, that is, the flow of backside gas, passes over the peripheral edge of the wafer and through the fluid passageways to thereby exclude deposition adjacent the peripheral edge of the wafer. The assembly 70 also includes a flow controller associated with the fluid passageways of the ring-shaped body for controlling fluid flow therethrough. Accordingly, the edge exclusion effect can be controlled without changing out fixed-dimension conventional exclusion rings. In addition, the temperature, deposition flow rates, and chemistry can be adjusted to optimize the film properties, while the edge exclusion can be controlled substantially independently in accordance with the invention.

In the illustrated first embodiment, the flow controller comprises a control body 75 having a plurality of fluid passageways 76 therein, and the control body is relatively movable with respect to the ring-shaped body 71. This relative movement provides a selectable amount of alignment between the fluid passageways 76, 73 of the control body 75 and the ring-shaped body, respectively, to thereby control fluid flow. In the illustrated embodiment, only four passageways 76, 73 are shown in each of the control body 75 and ring-shaped body 71 for clarity of illustration. Those of skill in the art will appreciate that the passageways may be relatively large in number and spaced evenly and relatively closely about a periphery of each body.

In the illustrated embodiment, the control body 75 and the ring-shaped body 71 are relatively rotatable, and the ring-shaped body 71 is fixed relative to the wafer support 43, and the control body is rotatable relative to the ring-shaped body. In other embodiments the control body 75 need not be ring-shaped, and could be moved in a lateral direction, for example, rather than being rotatable. The rotatable movement does offer advantages of simplicity of control and construction.

The control body 75 is illustratively positioned adjacent an upper surface of the ring-shaped body 71 opposite the wafer 45. The positions of the control body 75 and ring-shaped body 71 could be reversed in other embodiments. In the illustrated embodiment of the edge exclusion assembly 70, the fluid passageways 76 of the control body 75 have a substantially same cross-sectional area as the fluid passageways 73 of the ring-shaped body 71.

As the control body 75 is rotated, the passageways 76, 73 will move out of alignment, thereby restricting fluid flow therethrough. As shown in the corresponding sequence of drawing FIGS. 6–9, the control body 75 is relatively rotated a few degrees in a clockwise direction relative to the ring-shaped body 71. This relative rotation causes the effective cross-sectional area of the combined passageways 76, 73 to be less thereby creating more turbulence adjacent the wafer edge. The increased turbulence causes less deposition on the wafer edge.

Returning again more specifically to FIG. 1, the flow controller of the apparatus 40 also preferably comprises a drive device 47 for relatively moving the control body 75 and ring-shaped body 71 responsive to control signals. For example, the drive device 47 may be an electromagnetic actuator, such as a stepper motor, for example, that rotatably drives the control body 75 via the illustrated drive gear 49. Other approaches to accurately and repeatably move or rotate the control body 75 with respect to the ring-shaped body are also contemplated by the invention.

A guide ring and corresponding mating guide recess (not shown) may be provided on the control body and ring-shaped body, for example, to provide a bearing surface to facilitate accurate and smooth rotational movement. A suitable washer or form of lubricant may also be provided between the control body 75 and the ring-shaped body 71 to also facilitate smooth relative motion as will be appreciated by those skilled in the art. The combined thickness of the ring-shaped body 71 and control body 75 may be about the same as a conventional exclusion ring of the type manufactured and offered by Novellus Systems, Inc. of San Jose, Calif. In addition, the passageways 73, 76 may be angled outwardly or divergingly away from the wafer 45 as illustrated so that the flow of the backside gas does not adversely interfere with the flow of deposition gas as will be appreciated by those skilled in the art.

The control signals for the drive device 47 may be generated externally from the deposition chamber 41. As shown in the illustrated embodiment, these signal may be generated from the schematically illustrated edge exclusion flow setting signal generator 48. The signal generator can take many forms, for example, from a simple rotatable control knob and associated circuitry, to a portion of software running on a process control computer. Various position feedback devices or flow measurement sensors could also be incorporated into the flow controller of the present invention. Other embodiments and detailed implementations of the signal generator 48 and drive device 47 will be readily appreciated by those of skill in the art and require no further discussion herein.

A significant advantage of the invention is that the flow rate, and, hence the degree of edge exclusion, can be set without opening the deposition chamber 41 and suffering the resultant apparatus downtime. Also, as the openings become progressively occluded by deposition, the control signals could increase the alignment of the passageways 76, 73 to thereby maintain a constant flow rate. For a conventional exclusion ring, periodic plasma cleaning is required to maintain the passageways open to required tolerance. Accordingly, in addition to better controllability and the ability to optimize processing for deposition, the present invention may also provide increased time intervals between required maintenance procedures.

Having now generally described the principles and features of the invention with respect to a first specific embodiment, a second embodiment is now described with reference to FIGS. 10–21. These figures are best considered as three groups: FIGS. 10–13 illustrating a full open position, FIGS. 14–17 illustrating a first restricted flow position, and FIGS. 18–21 illustrating a second restricted flow position. In this second embodiment of the edge exclusion assembly 70', like elements are indicated with prime notation and are similar to those elements described above with reference to the first embodiment. Accordingly, each element need not be described again here in detail.

The illustrated exclusion ring assembly 70' includes the ring-shaped body 75'; however, in this embodiment, there are three sets of different sized openings 73a, 73b and 73c in decreasing size order. In can be seen in the groups of drawings that the three sets of passageways 73a, 73b and 73c permit selective alignment with any desired set to thereby control the flow rate. FIGS. 10–13 show the assembly 70' with the passageways 76' in the control body 75' aligned with the largest passageways 73a in the ring-shaped body 71'.

FIGS. 14–17 illustrate the control body 75' relatively rotated in a clockwise direction so that the intermediate sized passageways 73b are aligned with the passageways 76' in the control body 75'. Accordingly, the exclusion ring is in a first restricted flow position.

Along these same lines, FIGS. 18–21 illustrate the assembly 70' in the second restricted flow position. In other words, in this position the smallest passageways 73c are aligned with the passageways 76' in the control body 75'.

Those of skill in the art will readily appreciate that only two sets of different sized passageways may be used in some embodiments, yet in other embodiments, three or more may be used. Of course, although the different sized passageways 73a, 73b and 73c are illustrated in the ring-shaped body 71', it will be apparent to those skilled in the art that the different size passageways can alternately be provided in the control body 75'.

Turning now additionally to FIGS. 23–27, a third embodiment of the exclusion ring assembly 70" is now described. In this embodiment, respective iris diaphragms 81 are provided to control flow through each passageway 73" in the ring-shaped body 71". Each iris diaphragm 81 may include a plurality of slidable elements 82 which can be relatively positioned to create a desired opening as will be readily appreciated by those skilled in the art. In other words, the cross-sectional open area of the iris diaphragms 81 may be controlled to control fluid flow. Of course, in this embodiment, the flow controller also preferably includes a drive device 47" for controlling the iris diaphragms 81 responsive to control signals. These control signals can also be generated externally from the deposition chamber as discussed above.

In the illustrated embodiment, the iris diaphragms 81 are positioned between the lower ring-shaped body 71" with the passageways 73" therein, and an upper fixed ring-shaped body 85 with aligned passageways 86. In other embodiments, the upper fixed ring-shaped body 85 may not be needed as will be understood by those skilled in the art.

Figure 22:
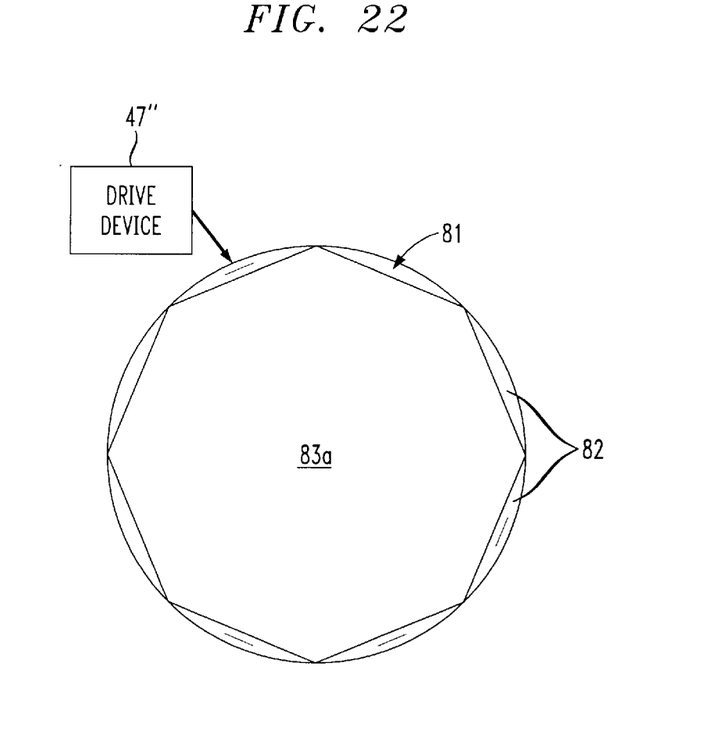
FIG. 22 is a schematic top plan view of an iris diaphragm used to control flow through a fluid passageway in a third embodiment of the edge exclusion assembly in accordance with the present invention and illustrating the iris diaphragm in the full open position.
Figure 23:
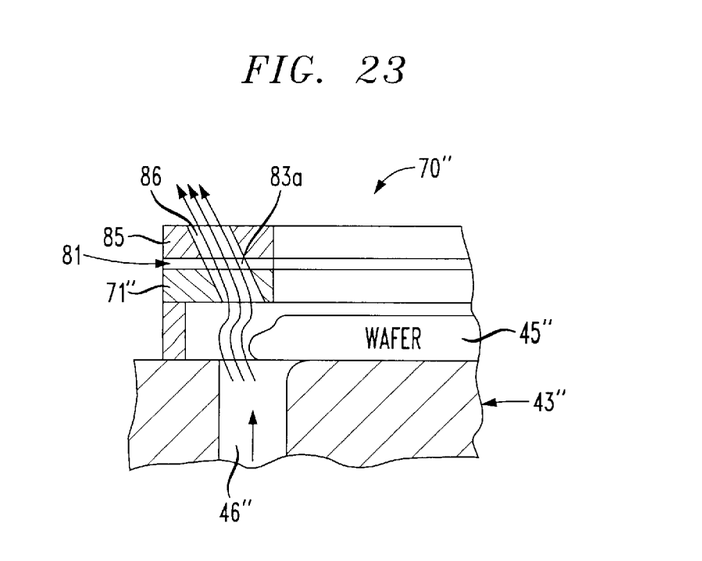
FIG. 23 is a greatly enlarged cross-sectional view of the wafer edge portion and adjacent portion of the edge exclusion assembly using the iris diaphragm as shown in FIG. 22.
Figure 24:
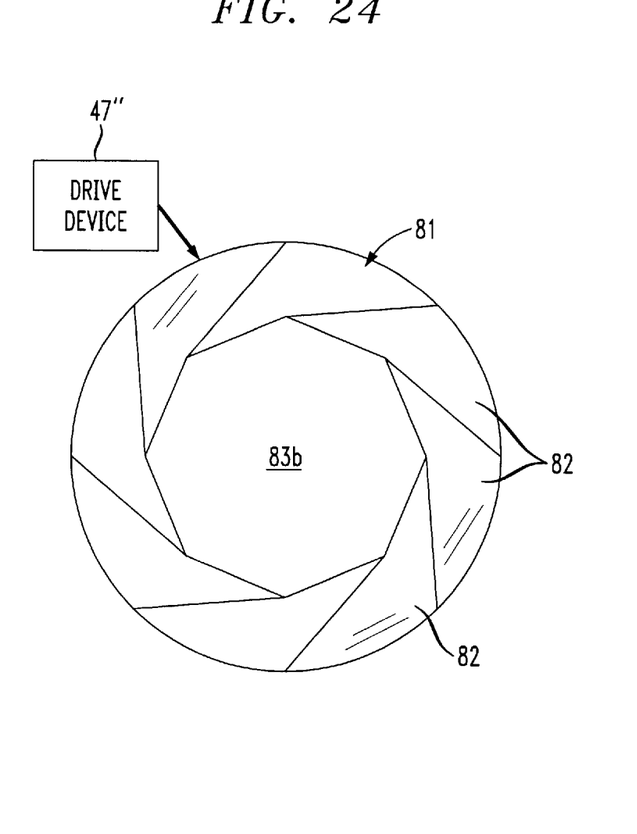
FIG. 24 is a schematic top plan view of the iris diaphragm as shown in FIG. 22 and illustrated in a first restricted flow position.
Figure 25:
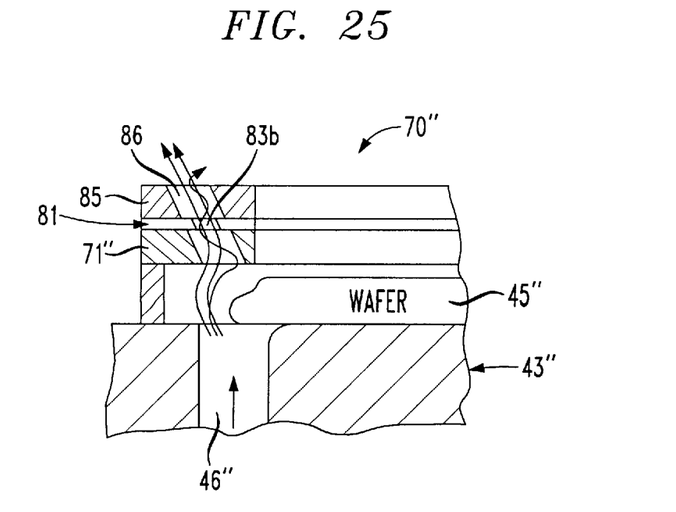
FIG. 25 is a greatly enlarged cross-sectional view of the wafer edge portion and adjacent portion of the edge exclusion assembly using the iris diaphragm as shown in FIG. 24.
Figure 26:
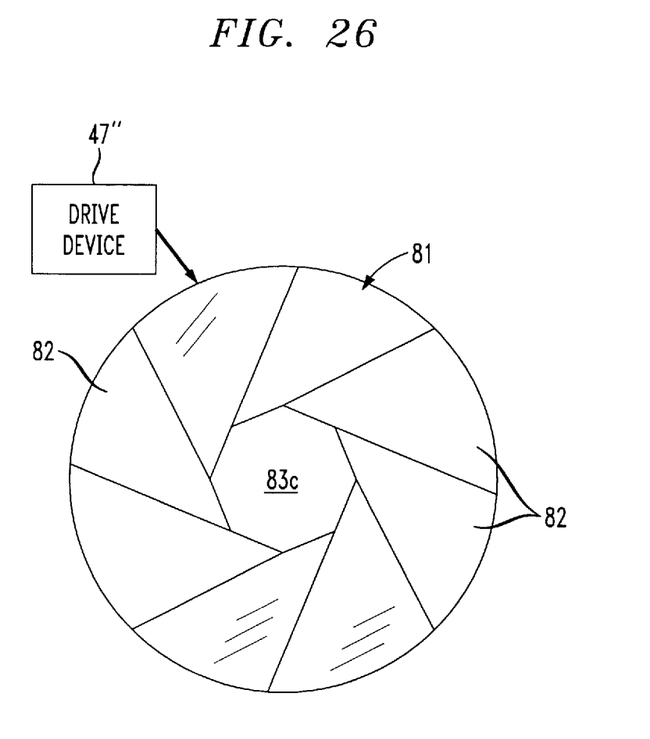
FIG. 26 is a schematic top plan view of the iris diaphragm as shown in FIG. 23 and illustrated in a second restricted flow position.
Figure 27:
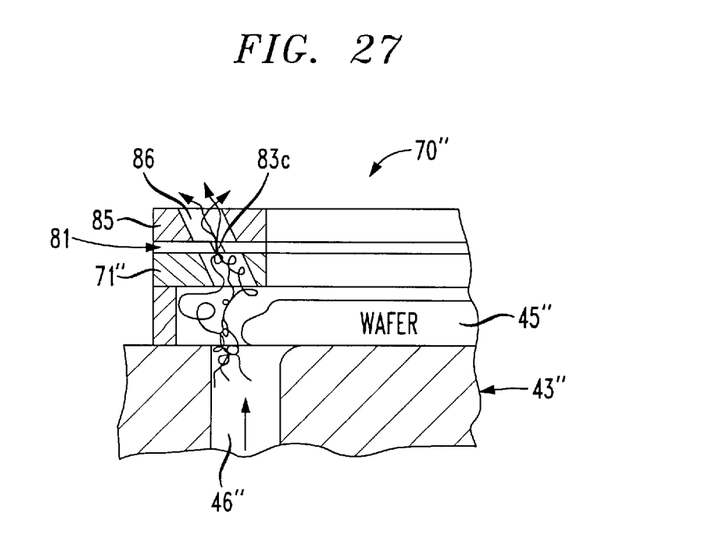
FIG. 27 is a greatly enlarged cross-sectional view of the wafer edge portion and adjacent portion of the edge exclusion assembly using the iris diaphragm as shown in FIG. 26.

For clarity of explanation, the third embodiment of the exclusion assembly 70" is shown in three different positions. In the fully open position (FIGS. 22 and 23) each of the iris diaphragms 81 are fully opened defining a large opening indicated by reference numeral 83a. Similarly, an intermediate or first restricted position is shown in FIGS. 24 and 25, wherein each of the iris diaphragms 81 define the intermediate opening 83b. Lastly, FIGS. 26 and 27 illustrated the iris opening at a second restricted position with the corresponding opening indicated by reference numeral 83c. Those of skill in the art will appreciate that the iris diaphragms 81 may provide essentially an infinite range of adjustment depending upon the actuators used to control the elements 82 and the control signals applied thereto.

A method aspect of the invention is for deposition exclusion adjacent a peripheral edge of a wafer 45 within a deposition chamber 41 and based upon fluid flow. The method preferably comprises positioning a ring-shaped body 71 extending inwardly from the peripheral edge of the wafer 45 and spaced above an adjacent front surface of the wafer, and wherein the ring-shaped body has a plurality of fluid passageways 73 extending therethrough. The method may also include setting a flow controller associated with the fluid passageways of the ring-shaped body for a desired fluid flow therethrough. In addition, the method may include the step of generating a fluid flow from adjacent a back surface of the wafer 45 to pass over the peripheral edge of the wafer and through the fluid passageways 73 of the ring-shaped body 71 to thereby exclude deposition adjacent the peripheral edge of the wafer.

In the illustrated embodiments, a beveled edge is shown on the wafer 45. The beveled edge may be especially benefitted by the increased precision and repeatability of deposition edge exclusion provided by the present invention. However, those skilled in the art will appreciate the benefits of the invention will flow to wafers having different shaped edges as well. Indeed, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A deposition apparatus comprising:

a deposition chamber;

a support for supporting a wafer in the deposition chamber;

a controllable edge exclusion assembly for excluding deposition adjacent a peripheral edge of the wafer based upon fluid flow and comprising
a ring-shaped body extending inwardly from the peripheral edge of the wafer and spaced above an adjacent front surface of the wafer, the ring-shaped body having a plurality of fluid passageways extending therethrough so that fluid flow from adjacent a back surface of the wafer passes over the peripheral edge of the wafer and through the fluid passageways to thereby exclude deposition adjacent the peripheral edge of the wafer, and
a flow controller adjacent the fluid passageways of said ring-shaped body for controlling fluid flow therethrough.

2. A deposition apparatus according to claim 1 wherein said flow controller comprises a control body having a plurality of fluid passageways therein; and wherein said control body is relatively movable with respect to the ring-shaped body to provide a selectable amount of alignment between the fluid passageways of said control body and said ring-shaped body to thereby control fluid flow.

3. A deposition apparatus according to claim 2 wherein said control body and said ring-shaped body are relatively rotatable.

4. A deposition apparatus according to claim 3 wherein said ring-shaped body is fixed relative to said wafer support, and said control body is rotatable relative to said ring-shaped body.

5. A deposition apparatus according to claim 2 wherein said control body is positioned adjacent an upper surface of said ring-shaped body opposite the wafer.

6. A deposition apparatus according to claim 2 wherein the fluid passageways of said control body have a substantially same cross-sectional area as the fluid passageways of said ring-shaped body.

7. A deposition apparatus according to claim 2 wherein at least one of said control body and said ring-shaped body has a plurality of sets of fluid passageways therein of different cross-sectional areas.

8. A deposition apparatus according to claim 2 wherein said flow controller comprises a drive device for relatively moving said control body and said ring-shaped body responsive to control signals generated externally from said deposition chamber.

9. A deposition apparatus according to claim 2 wherein said control body has a ring shape.

10. A deposition apparatus according to claim 1 wherein said flow controller comprises respective iris diaphragms for the fluid passageways.

11. A deposition apparatus according to claim 10 wherein said flow controller comprises a drive device for operating said iris diaphragms responsive to control signals generated externally from said deposition chamber.

12. A deposition apparatus according to claim 1 wherein the fluid passageways of said ring-shaped body are angled upwardly and radially outwardly from the wafer.

13. A controllable edge exclusion assembly for controllably excluding deposition adjacent a peripheral edge of a wafer within a deposition chamber and based upon fluid flow, the controllable edge exclusion assembly comprising:
a ring-shaped body extending inwardly from the peripheral edge of the wafer and spaced above an adjacent front surface of the wafer, the ring-shaped body having a plurality of fluid passageways extending therethrough so that fluid flow from adjacent a back surface of the wafer passes over the peripheral edge of the wafer and through the fluid passageways to thereby exclude deposition adjacent the peripheral edge of the wafer; and
a flow controller adjacent the fluid passageways of said ring-shaped body for controlling fluid flow therethrough.

14. A controllable edge exclusion assembly according to claim 13 wherein said flow controller comprises a control body having a plurality of fluid passageways therein; and wherein said control body is relatively movable with respect to the ring-shaped body to provide a selectable amount of alignment between the fluid passageways of said control body and said ring-shaped body to thereby control fluid flow.

15. A controllable edge exclusion assembly according to claim 14 wherein said control body and said ring-shaped body are relatively rotatable.

16. A controllable edge exclusion assembly according to claim 15 wherein said ring-shaped body is fixed relative to said wafer support, and said control body is rotatable relative to said ring-shaped body.

17. A controllable edge exclusion assembly according to claim 14 wherein said flow controller comprises respective iris diaphragms for the fluid passageways.

18. A controllable edge exclusion assembly according to claim 14 wherein said flow controller comprises a drive device for controlling fluid flow responsive to control signals.

19. A controllable edge exclusion assembly for controllably excluding deposition adjacent a peripheral edge of a wafer within a deposition chamber and based upon fluid flow, the controllable edge exclusion assembly comprising:
a ring-shaped body extending inwardly from the peripheral edge of the wafer and spaced above an adjacent front surface of the wafer, the ring-shaped body having a plurality of fluid passageways extending therethrough so that fluid flow from adjacent a back surface of the wafer passes over the peripheral edge of the wafer and through the fluid passageways to thereby exclude deposition adjacent the peripheral edge of the wafer, and
a control body having a plurality of fluid passageways therein and being relatively movable with respect to said ring-shaped body.

20. A controllable edge exclusion assembly according to claim 19 wherein said control body and said ring-shaped body are relatively rotatable.

21. A controllable edge exclusion assembly according to claim 19 wherein said control body is positioned adjacent an upper surface of said ring-shaped body opposite the wafer.

22. A controllable edge exclusion assembly according to claim 19 wherein the fluid passageways of said control body have a substantially same cross-sectional area as the fluid passageways of said ring-shaped body.

23. A controllable edge exclusion assembly according to claim 19 wherein a least one of said control body and said ring-shaped body has a plurality of sets of fluid passageways therein of different cross-sectional areas.

24. A controllable edge exclusion assembly according to claim 19 wherein said flow controller comprises a drive device for relatively moving said control body and said ring-shaped body responsive to control signals.

25. A controllable edge exclusion assembly according to claim 19 wherein said control body has a ring shape.

26. A controllable edge exclusion assembly according to claim 19 wherein the fluid passageways of said ring-shaped body are angled upwardly and radially outwardly from the wafer.

27. A controllable edge exclusion assembly for controllably excluding deposition adjacent a peripheral edge of a wafer within a deposition chamber and based upon fluid flow, the controllable edge exclusion assembly comprising:

a ring-shaped body extending inwardly from the peripheral edge of the wafer and spaced above an adjacent front surface of the wafer, the ring-shaped body having a plurality of fluid passageways extending therethrough so that fluid flow from adjacent a back surface of the wafer passes over the peripheral edge of the wafer and through the fluid passageways to thereby exclude deposition adjacent the peripheral edge of the wafer; and an iris diaphragm associated with each of the fluid passageways of said ring-shaped body for controlling fluid flow therethrough.

28. A controllable edge exclusion assembly according to claim 27 wherein said flow controller comprises a drive device for operating said iris diaphragms responsive to control signals.

29. A controllable edge exclusion assembly according to claim 27 wherein the fluid passageways of said ring-shaped body are angled upwardly and radially outwardly from the wafer.

30. A method for deposition exclusion adjacent a peripheral edge of a wafer within a deposition chamber and based upon fluid flow, the method comprising the steps of:

positioning a ring-shaped body extending inwardly from the peripheral edge of the wafer and spaced above an adjacent front surface of the wafer, the ring-shaped body having a plurality of fluid passageways extending therethrough;

setting a flow controller adjacent the fluid passageways of the ring-shaped body for a desired fluid flow therethrough; and generating a fluid flow from adjacent a back surface of the wafer to pass over the peripheral edge of the wafer and through the fluid passageways of the ring-shaped body to thereby exclude deposition adjacent the peripheral edge of the wafer.

31. A method according to claim 30 wherein the flow controller comprises a control body having a plurality of fluid passageways therein and being relatively movable with respect to the ring-shaped body; and wherein the step of setting the flow controller comprises relatively moving the control body to provide a selected amount of alignment between the fluid passageways of the control body and the ring-shaped body to thereby control fluid flow.

32. A method according to claim 31 wherein the control body and the ring-shaped body are relatively rotatable.

33. A method according to claim 31 wherein the fluid passageways of the control body have a substantially same cross-sectional area as the fluid passageways of the ring-shaped body.

34. A method according to claim 31 wherein at least one of the control body and the ring-shaped body has a plurality of sets of fluid passageways therein of different cross-sectional areas.

35. A method according to claim 30 wherein the flow controller comprises respective iris diaphragms for the fluid passageways; and wherein the step of setting the flow control device comprises setting the iris diaphragms to a desired cross-sectional area.

36. A method according to claim 30 wherein the step of setting the control device comprises setting the control device responsive to control signals from outside the deposition chamber.

* * * * *